United States Patent
Kim et al.

(10) Patent No.: US 9,922,585 B2
(45) Date of Patent: Mar. 20, 2018

(54) DISPLAY DEVICE AND METHOD OF TESTING THE SAME

(71) Applicant: LG Display Co., Ltd., Seoul (KR)

(72) Inventors: Kakyung Kim, Gyeonggi-do (KR); Euihyun Chung, Gyeonggi-do (KR); Yeseul Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 55 days.

(21) Appl. No.: 15/147,059

(22) Filed: May 5, 2016

(65) Prior Publication Data

US 2016/0379906 A1    Dec. 29, 2016

(30) Foreign Application Priority Data

Jun. 24, 2015  (KR) .................. 10-2015-0089828

(51) Int. Cl.
| | | |
|---|---|---|
| *G01R 31/26* | (2014.01) | |
| *G09G 3/00* | (2006.01) | |
| *G09G 3/36* | (2006.01) | |
| *H01L 21/66* | (2006.01) | |

(52) U.S. Cl.
CPC ........... *G09G 3/006* (2013.01); *G09G 3/3688* (2013.01); *G09G 2310/0297* (2013.01); *H01L 22/32* (2013.01)

(58) Field of Classification Search
CPC .............................. G01R 33/09; G01R 33/093
USPC ............................ 324/252, 200, 244, 760.01
See application file for complete search history.

(56) References Cited

U.S. PATENT DOCUMENTS

| | | | | |
|---|---|---|---|---|
| 7,719,027 B2* | 5/2010 | Chen | ................... | H01L 23/3107 257/177 |
| 2004/0169262 A1* | 9/2004 | Oliver | ............... | H01L 23/49562 257/676 |
| 2005/0190624 A1* | 9/2005 | Kasai | ....................... | G11C 7/10 365/222 |
| 2008/0078233 A1* | 4/2008 | Larson | ................. | G01N 29/022 73/24.04 |
| 2008/0239265 A1* | 10/2008 | Den Boef | ............ | G01N 21/956 355/53 |
| 2009/0060790 A1* | 3/2009 | Okaguchi | ............ | G01N 29/022 422/68.1 |

* cited by examiner

*Primary Examiner* — Giovanni Astacio-Oquendo
(74) *Attorney, Agent, or Firm* — Morgan, Lewis & Bockius LLP

(57) ABSTRACT

A display device includes a display panel with signal wire pads connected to data lines; an integrated circuit (IC) that feeds a data voltage to the data lines; a multiplexer disposed on a substrate of the display panel, between the data lines and the integrated circuit; a flexible circuit board bonded onto the substrate of the display panel and connected to the signal wire pads; and a test circuit on the substrate of the display panel.

15 Claims, 15 Drawing Sheets

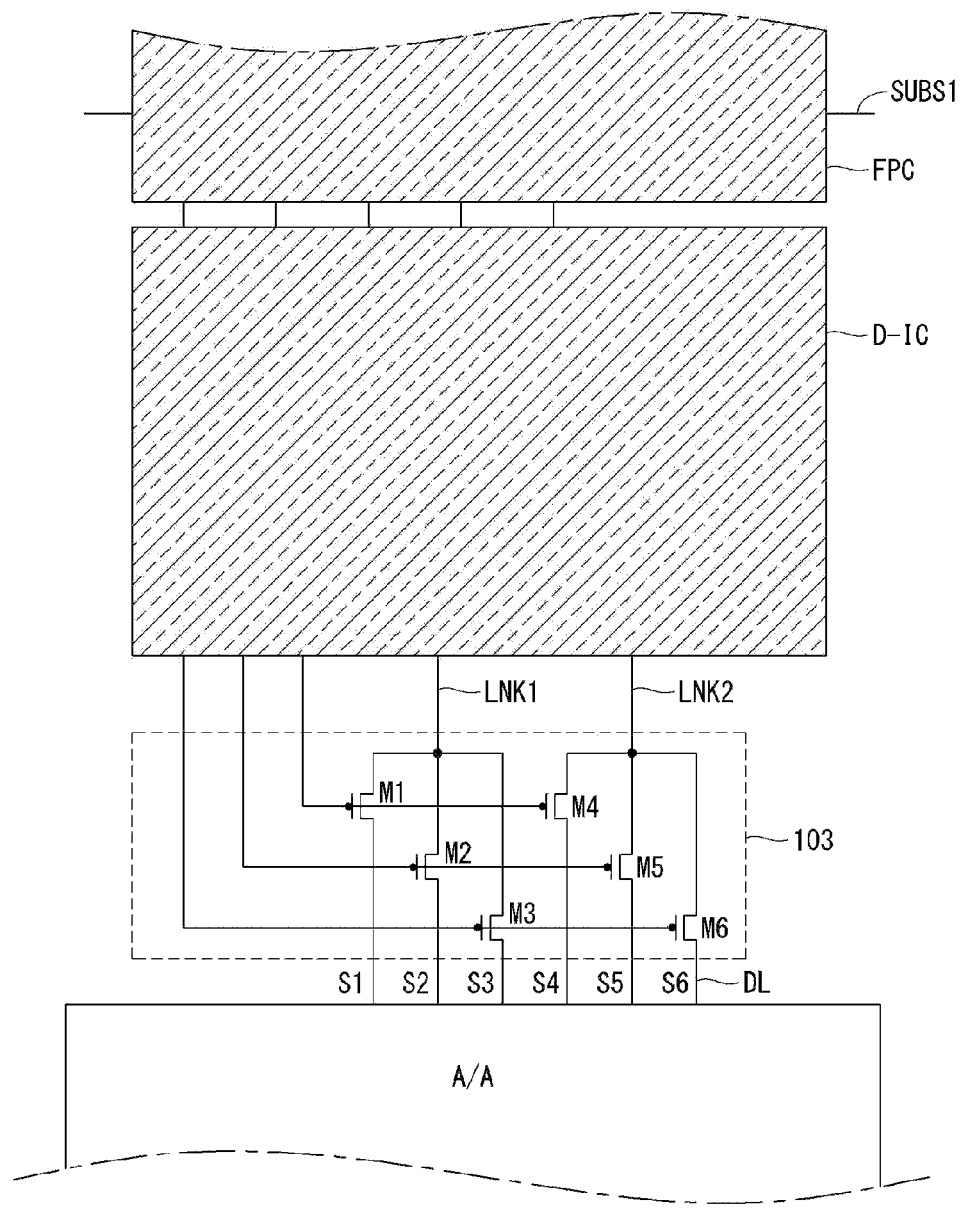

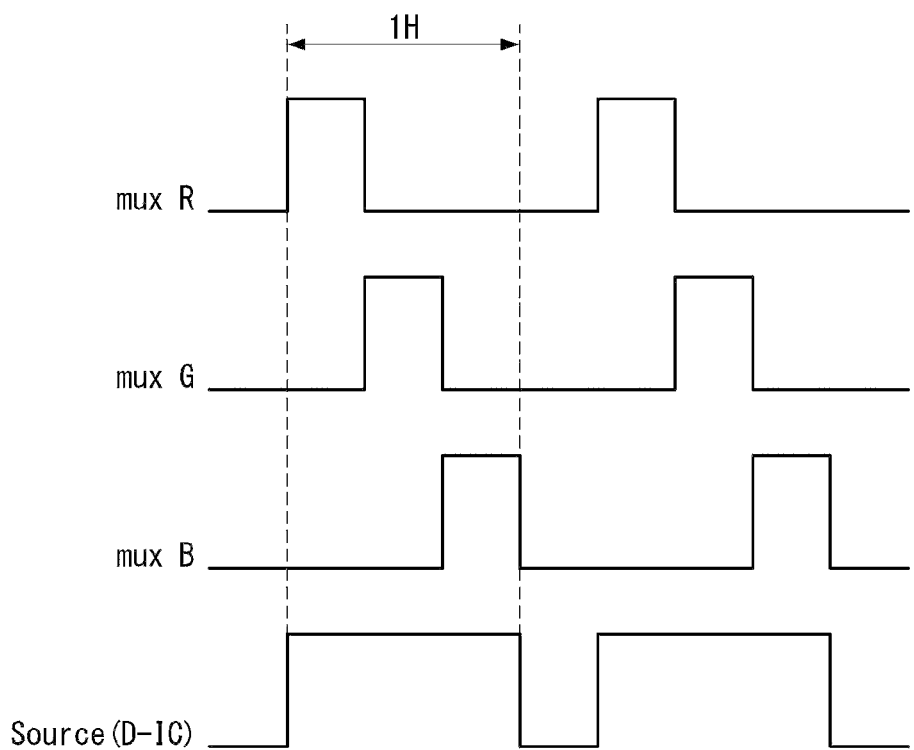

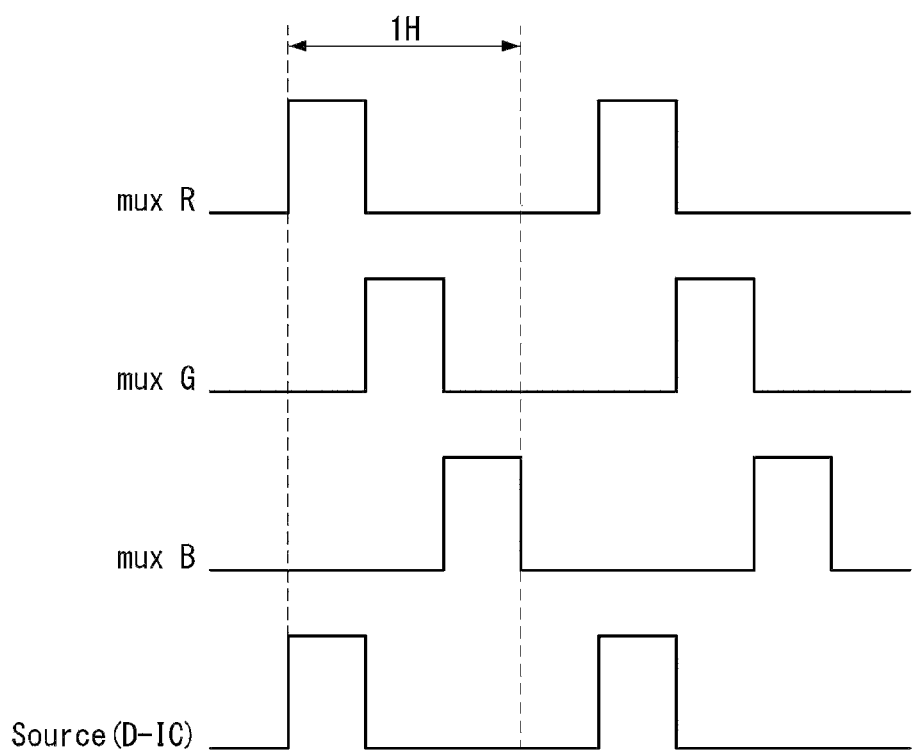

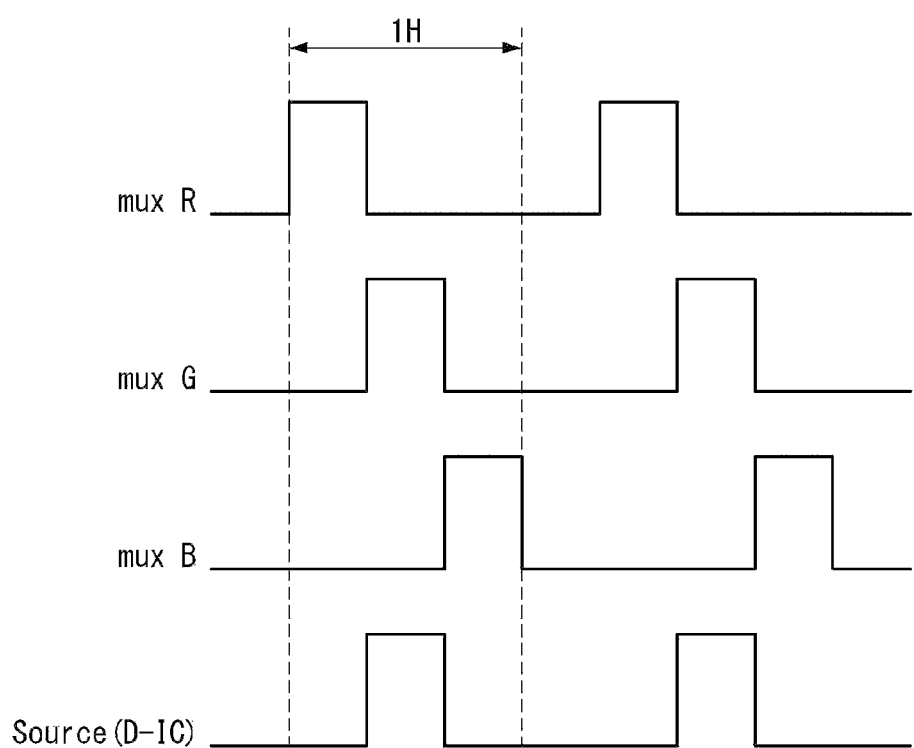

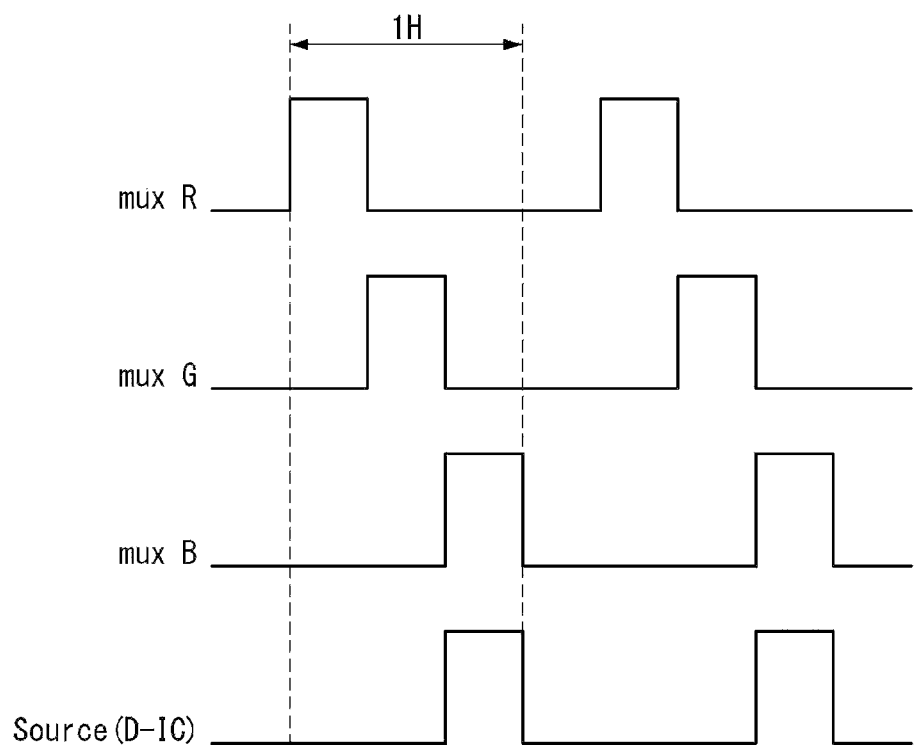

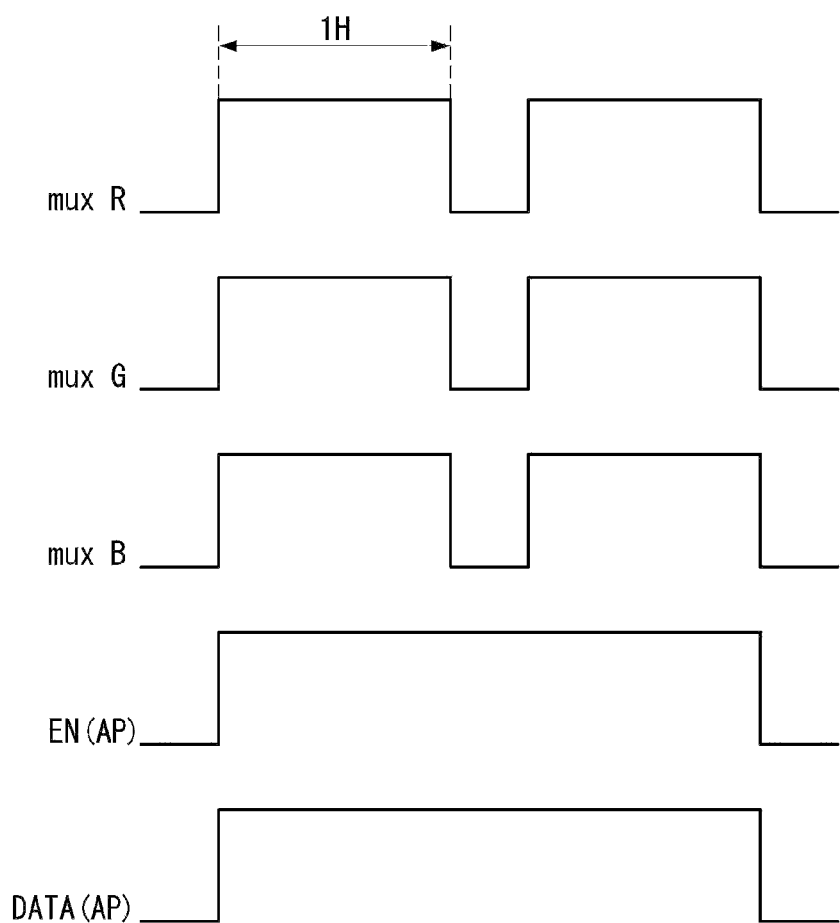

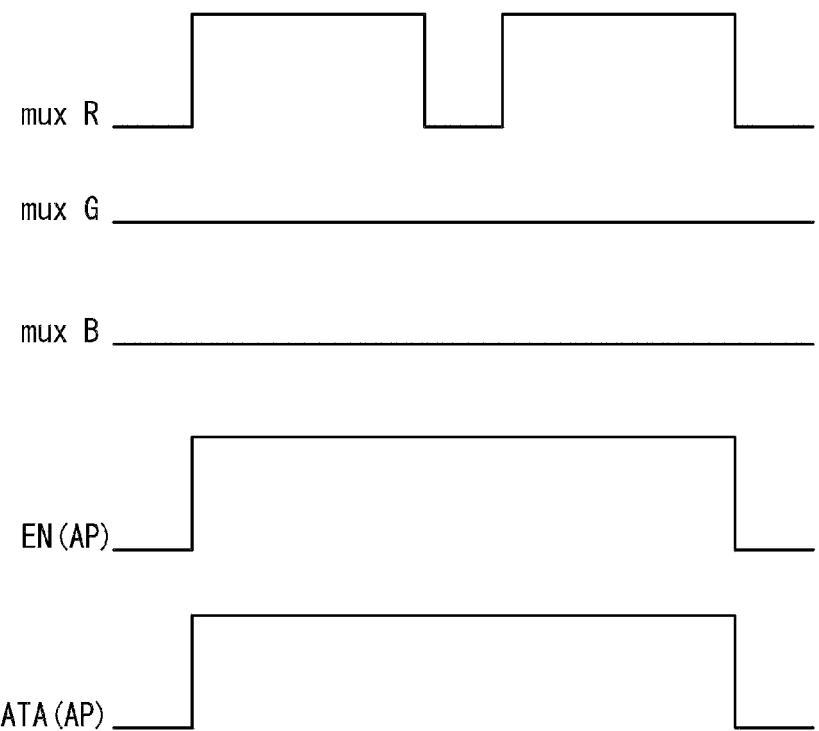

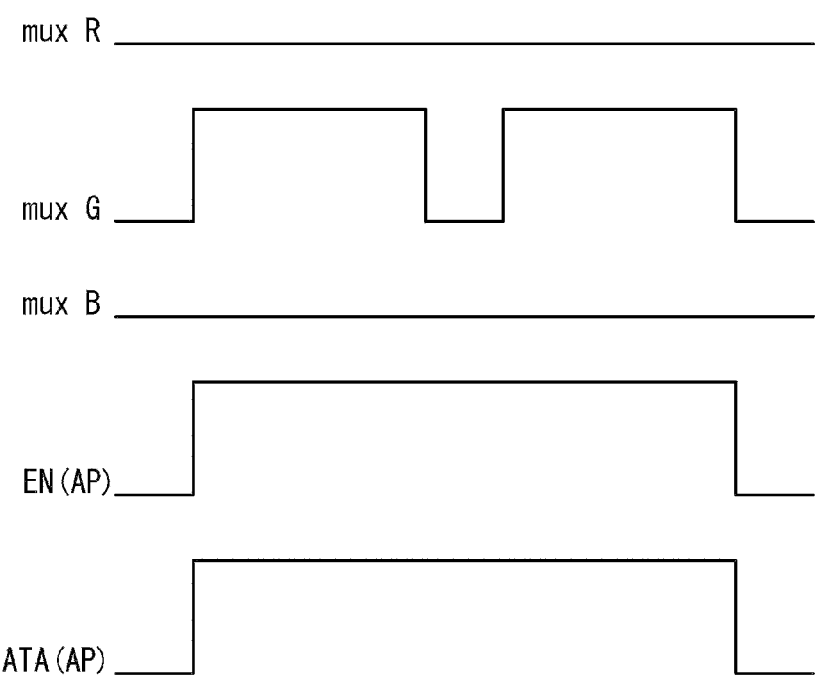

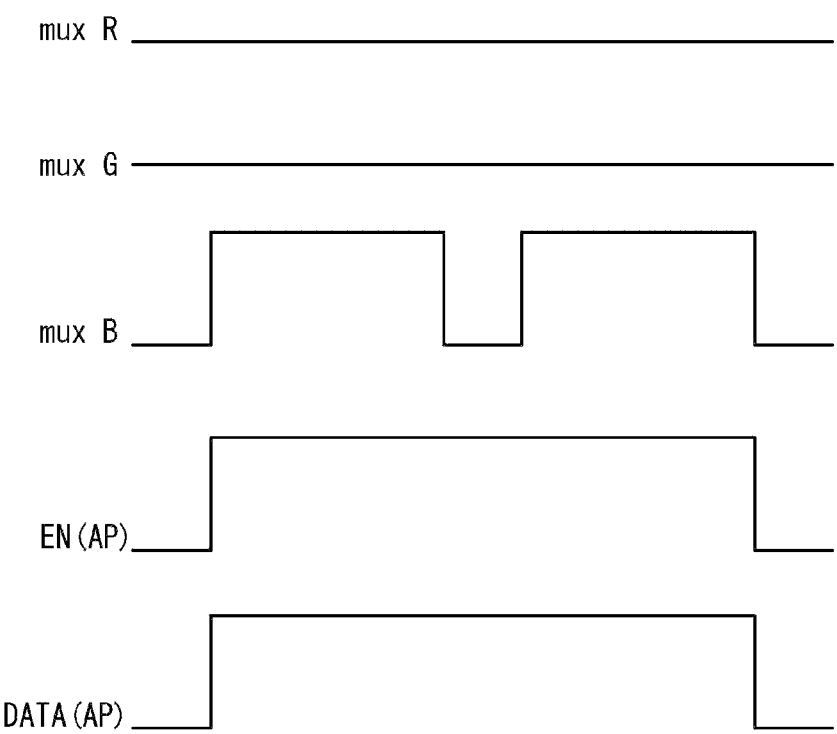

DISPLAY DEVICE AND METHOD OF TESTING THE SAME

This application claims the priority benefit of Korean Patent Application No. 10-2015-0089828 filed on Jun. 24, 2015, which is hereby incorporated herein by reference for all purposes as if fully set forth herein.

BACKGROUND

Field of the Invention

The present invention relates to a display device that allows for an auto-probe test and a method of testing the same.

Discussion of the Related Art

Various flat panel displays are being developed, including liquid crystal display devices (LCDs), organic light emitting diode displays (OLED displays), plasma display panels (PDPs), electrophoretic display devices (EPDs), etc.

A liquid crystal display displays an image by controlling an electric field applied to liquid crystal molecules in phase with a data voltage. In an active-matrix liquid crystal display, each pixel has a thin film transistor (hereinafter, referred to as "TFT").

A manufacturing process of a liquid crystal display comprises a substrate cleaning process, a substrate patterning process, an alignment layer forming/rubbing process, a substrate bonding and liquid crystal dropping process, a drive circuit mounting process, a test process, a repair process, a liquid crystal module assembly process, etc.

In the substrate cleaning process, impurities on the surfaces of upper and lower glass substrates are removed with a cleaning solution. In the substrate patterning process, signal wires comprising data lines and gate lines, TFTs, pixel electrodes, a common electrode, etc. are formed on the lower glass substrate. Then, in the substrate patterning process, a black matrix, color filters, etc. are formed on the upper glass substrate. In the alignment layer forming/rubbing process, alignment layers are applied onto the glass substrates, and the alignment layers are rubbed with a rubbing cloth or optically aligned. Through these processes, data lines supplied with a video data voltage, gate lines intersecting the data lines and sequentially supplied with a scan signal, i.e., gate pulse, and a TFT array comprising TFTs formed at the intersections of the data lines and gate lines, pixel electrodes connected to the TFTs, and storage capacitors are formed on the lower glass substrate. In case of vertical electric field displays such as TN (Twisted Nematic) displays and VA (Vertical Alignment) displays, a common electrode is formed on the upper glass substrate. In case of horizontal electric field displays such as in-plane switching (IPS) displays and fringe field switching (FFS) displays, the common electrode, together with the pixel electrodes, is formed on the lower glass substrate. Polarizers are bonded to the upper and lower glass substrates, respectively.

In the substrate bonding and liquid crystal dropping process, a sealant is drawn to drop liquid crystals onto any one of the upper and lower substrates of the display panel, and the upper and lower glass substrates are bonded together with the sealant. A liquid crystal layer is defined by a liquid crystal area defined by the sealant.

In the drive circuit mounting process, an integrated circuit (IC) with a data drive circuit is bonded with an anisotropic conductive film (ACF) to data pads of the display panel by a chip-on-glass (COG) process or tape automated bonding (TAB) process. A gate drive circuit may be formed directly on the lower glass substrate by a gate-in-panel (GIP) process, or bonded with an ACF to gate pads of the display pane by the tape automated bonding (TAB) process during the drive circuit mounting process. In the drive circuit mounting process, ICs and a printed circuit board (PCB) are connected by a flexible circuit board such as a flexible printed circuit board (FPC), a flexible flat cable (FFC), etc.

The test process comprises a test on drive circuits, a wiring test on data and gate lines formed on a TFT array substrate, a test to be performed after the formation of pixel electrodes, electrical and lighting tests to be performed after the substrate bonding and liquid crystal dropping process, etc. In the repair process, any defects found in the test process are repaired.

Once the display panel is completed through the above-described processes, the liquid crystal module assembly process is conducted. In the liquid crystal module assembly process, a backlight unit is aligned under the display panel, and the display panel and the backlight unit are assembled using case tools such as a guide, casing member, etc.

The auto-probe test makes it possible to detect defects in the signal wires or thin film pattern on the substrates by conducting a lighting test on the substrates of the display panel prior to the drive circuit mounting process.

To enable the auto-probe test, auto-probe test pads (hereinafter, referred to as "AP pads") coming into contact with needles of an auto-probe testing device are contacted to the lower glass substrate, and the wires (hereinafter, referred to as "AP wires") connecting to the AP pads are connected to switching elements connected to the bottom of the display panel along the left and right bezels of the display panel. The AP pads AP are formed in a bezel area BZ outside an active area A/A, as shown in FIG. 1. However, the AP pads AP make it difficult for the display device to have a narrow bezel design. "PAD" of FIG. 1 denotes data pads connected to the ends of the data lines. Output signals from the ICs are fed to the data lines via the data pads. A pixel array for displaying an image is formed in the active area A/A. The bezel area is a non-display section outside the active area on the display panel.

The switching elements connected to the AP wires are individually connected to the data lines. Since the display panel has many switching elements subjected to a lighting test, the switching elements may increase the rate of defects in the display panel in the manufacturing process.

Because of the arrangement of the AP pads and the AP wires, the conventional auto-probe testing method does not allow for checking whether output terminals in the ICs and data links in the active area A/A are disconnected (or open). The data links interconnect the data pads and the data lines.

In wearable devices, display panels come in various designs. For example, display panels for smart watches are designed in a disc shape, and displays panels for automotive dashboards are designed in various curved shapes. Since these display panels have no space for the AP pads, the lighting test is not available.

SUMMARY

Accordingly, the present invention is directed to a display device and a method of testing the same that substantially obviate one or more of the problems due to limitations and disadvantages of the related art.

An object of the present invention is to provide a display device that allows for testing regardless of the shape of a display panel and that has a narrow bezel.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display device comprises a pixel array comprising pixels arranged in a matrix by the intersections of data lines and gate lines; a multiplexer connected to the data lines; and a test circuit comprising switching elements to be tested and test pads.

The switching elements to be tested are connected to signal wire pads or to the multiplexer, the signal wires being connected to the data lines. The test pads are connected to the switching elements to be tested.

In another aspect, a display device comprises a display panel with signal wire pads connected to data lines; an integrated circuit (IC) that feeds a data voltage to the data lines; a multiplexer disposed on a substrate of the display panel, between the data lines and the integrated circuit; a flexible circuit board bonded onto the substrate of the display panel and connected to the signal wire pads; and a test circuit disposed on the substrate of the display panel.

The test circuit is covered by the integrated circuit or flexible printed circuit on the substrate of the display panel.

In another aspect, a method of testing a display device by using a test circuit having switching elements to be tested and test pads comprises connecting a multiplexer to data lines on a substrate of a display panel; connecting the switching elements to be tested to signal wire pads or to the multiplexer, on the substrate of the display panel, the signal wire pads being connected to the data lines; connecting the test pads to the switching elements to be tested, on the substrate of the display panel; and applying a test signal to the test pads in a test process to turn on the switching elements to be tested and feeding the test signal to the data lines via the multiplexer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 3B is a view showing a drive IC and an FPC which are bonded onto the display panel after the drive IC mounting process;

FIGS. 5 to 6C are waveform diagrams showing the operation of the multiplexer when an input image is reproduced on the display panel;

FIGS. 7 to 8C are waveform diagrams showing the operation of the multiplexer and auto-probe test circuit in a lighting test;

DETAILED DESCRIPTION

Figure 1:
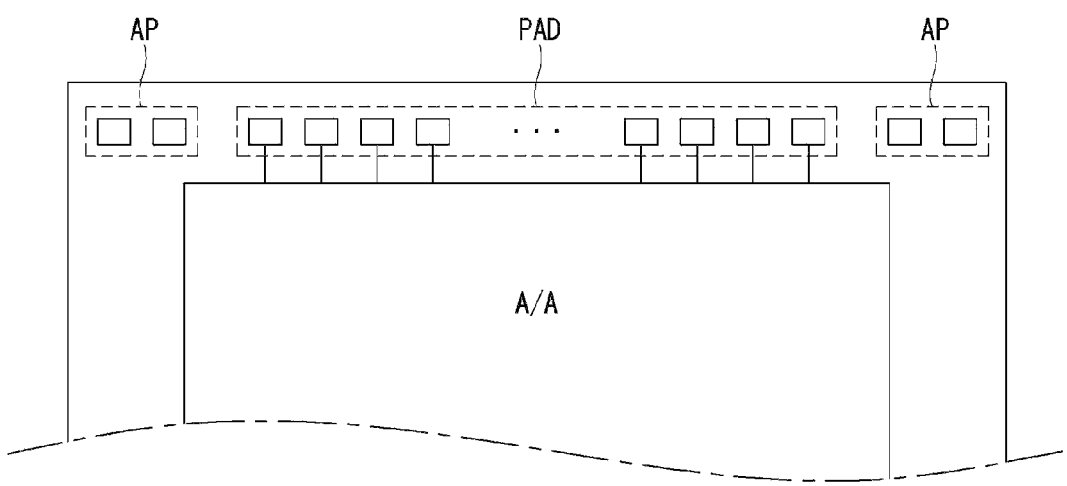
FIG. 1 is a view showing pads for an auto-probe test in a display device according to the related art.
Figure 2:
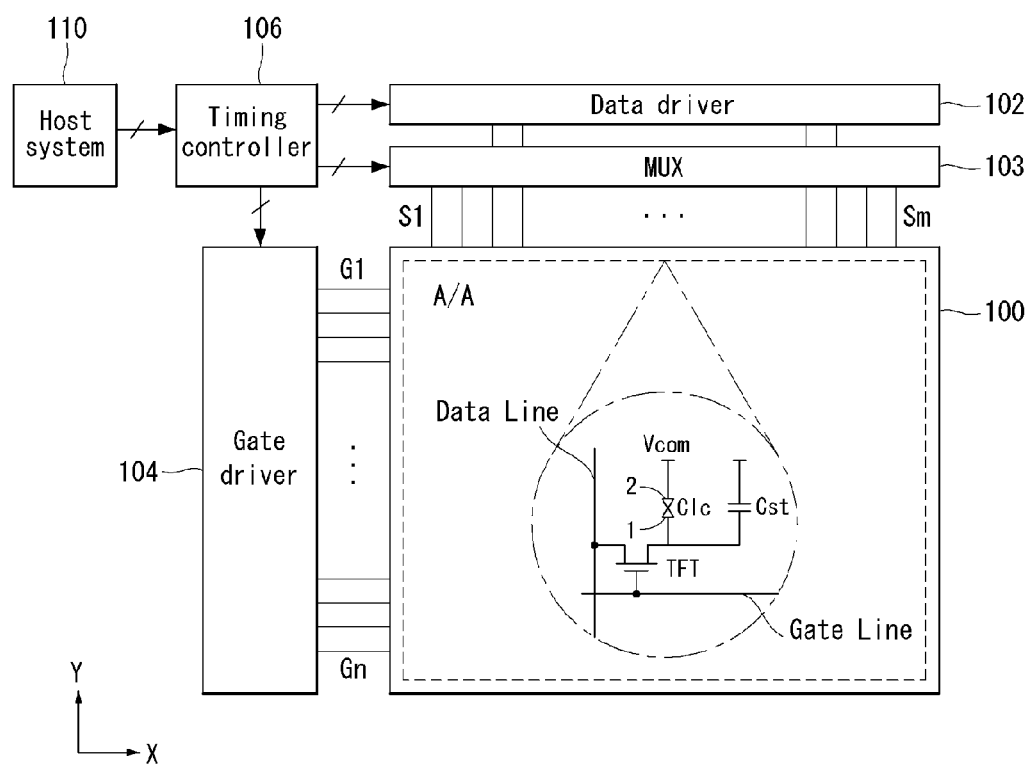
FIG. 2 is a block diagram schematically showing a display device according to the present invention.

Hereinafter, exemplary embodiments of the present invention will be described in detail with reference to the accompanying drawings. Like reference numerals designate substantially like elements throughout the specification. In the following description, detailed descriptions of well-known functions or configurations associated with the present invention will be omitted if they are deemed to unnecessarily obscure the subject matters of the present invention.

A display device of this invention may be implemented as a flat panel display, such as a liquid crystal display (LCD), a field emission display (FED), a plasma display panel (PDP), an organic light emitting display (OLED), or an electrophoretic display (EPD). Although the following embodiment will be described by taking a liquid crystal display as an example of the flat panel display, the present invention is not limited thereto. For example, the present invention is applicable to any display device that requires an auto-probe test.

Referring to FIG. 1, a display device of this invention comprises a display panel 100 with a pixel array and a display panel drive circuit for writing data of an input image to the display panel 100. A backlight unit for giving off uniform light over the display panel 100 may be disposed under the display panel 100.

The display panel 100 comprises upper and lower substrates facing each other, with a liquid crystal layer interposed between them. A pixel array for displaying an input image is formed in the active area of the display panel 100. The pixel array comprises pixels arranged in a matrix by the intersections of data lines S1 to Sm and gate lines G1 to Gm.

The lower substrate of the display panel 100 comprises data lines S1 to Sm, gate lines G1 to Gn, TFTs, pixel electrodes 1 connected to the TFTs, and storage capacitors Cst connected to the pixel electrodes 1.

Each pixel may comprise a red (R) subpixel, a green (G) subpixel, a blue (B) subpixel to represent colors. Also, each pixel may further comprise a white (W) subpixel. By using a rendering algorithm in a PenTile pixel array, one pixel may be implemented as two subpixels. The pixels adjust the amount of light transmission by using liquid crystal molecules, which are driven by the voltage difference between the pixel electrodes 1 charged with a data voltage through the TFTs and a common electrode 2 to which a common voltage Vcom is applied.

The TFTs formed on the lower substrate of the display panel 100 may be implemented as amorphous Si (a-Si) TFTs, low temperature polysilicon (LTPS) TFTs, oxide TFTs, etc. The TFTs are formed at the intersections of the data lines S1 to Sm and gate lines G1 to Gn. The TFTs feed a data voltage from the data lines to the pixel electrodes 1 in response to a gate pulse.

A black matrix BM and a color filter array consisting of color filters are formed on the upper substrate of the display panel 100. In case of vertical electric field displays such as TN (Twisted Nematic) displays and VA (Vertical Alignment) displays, the common electrode 2 is formed on the upper glass substrate. In case of horizontal electric field displays such as in-plane switching (IPS) displays and fringe field switching (FFS) displays, the common electrode 2, together with the pixel electrodes 1, is formed on the lower glass substrate. Polarizers are attached to the upper and lower glass substrates of the display panel 100, respectively. Alignment layers for setting a pre-tilt angle of liquid crystals are formed on the upper and lower glass substrates, respectively.

The display device of this invention may be implemented as any type of display device including a transmissive liquid crystal display, a semi-transmissive liquid crystal display, and a reflective liquid crystal display. The transmissive liquid crystal display and the semi-transmissive liquid crystal display require a backlight unit. The backlight unit may be implemented as a direct-type backlight unit or an edge-type backlight unit.

The display panel drive circuit writes data of an input image to the pixels. The display panel drive circuit comprises a data driver 102, a gate driver 104, and a timing controller 106.

A multiplexer (MUX) 103 is formed on the display panel 100. The multiplexer 103 is disposed between the data driver 102 and the data lines S1 to Sm.

Output channels of the data driver 102 are connected to the data lines S1 to Sm via the multiplexer 103. The data driver 102 receives data of an input image from the timing controller 106. The data driver 102 converts digital video data of an input image to a gamma compensation voltage under control of the timing controller 106 and outputs a data voltage. The data voltage is fed to the data lines S1 to Sm via the multiplexer 103.

The multiplexer 103 is disposed between the data driver 102 and the data lines S1 to Sm. The multiplexer 103 distributes a data voltage input from the data driver 102 to the data lines S1 to Sm. In case of a 1-to-3 multiplexer, the multiplexer 103 supplies a data voltage input through one output channel of the data driver 102 to three data lines in a time division method. Accordingly, the number of ICs in the data driver 102 required to drive the display panel 100 can be reduced to ⅓ by using the 1-to-3 multiplexer.

Figure 9:
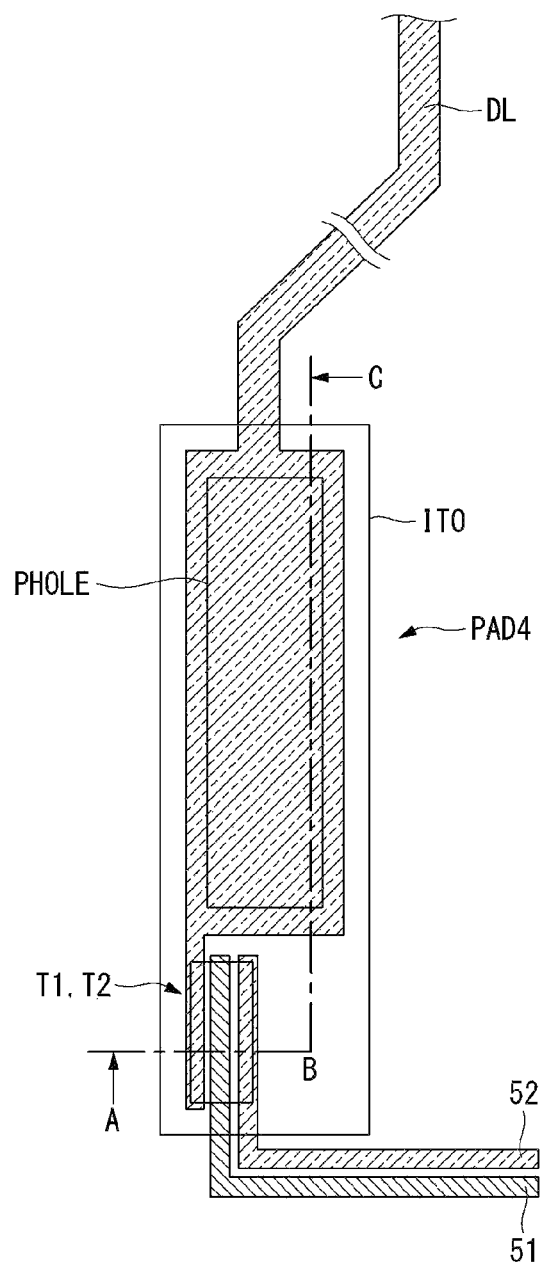
FIG. 9 is a top plan view showing an example of the auto-probe test circuit embedded in a pad.
Figure 10:
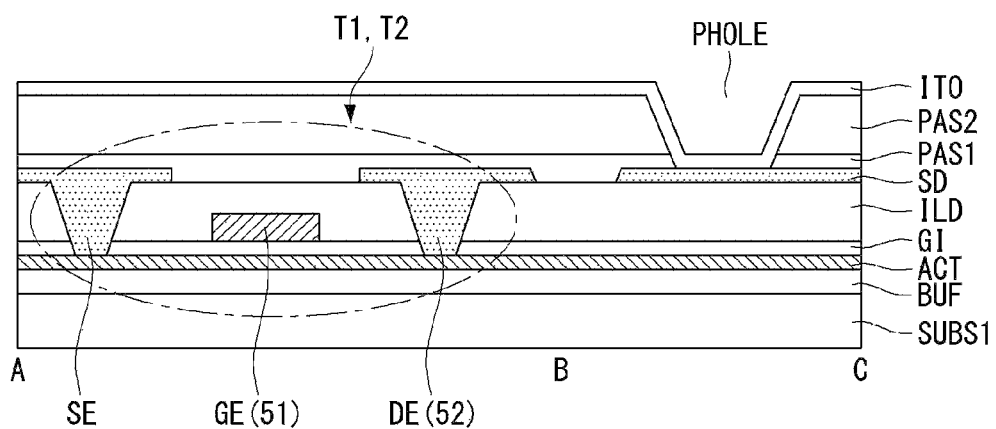
FIG. 10 is a cross-sectional view of a pad structure taken along the line "A-B-C" of FIG. 9.

The multiplexer 103 is connected to an auto-probe test circuit (hereinafter, referred to as "AP test circuit") for a lighting test. The AP test circuit comprises AP pads and transistors (hereinafter, referred to as "AP TR") connected to the AP pads, as shown in FIG. 3. At least part of the AP test circuit may be connected to signal wire pads connected to the data lines S1 to Sm. The signal wire pads are illustrated in FIGS. 3, 9, and 10.

The gate driver 104 feeds a gate pulse to the gate lines G1 to Gn under control of the timing controller 106. The gate pulse is synchronized with the data voltage fed to the data lines S1 to Sm.

The timing controller 106 transmits digital video data of an input image received from a host system 110 to the data driver 102. The timing controller 106 receives timing signals synchronized with the input image data from the host system 110. The timing signals comprise a vertical synchronization signal Vsync, a horizontal synchronization signal Hsync, a data enable signal DE, a main clock DCLK, etc. The timing controller 106 controls the operation timings of the data driver 102, gate driver 106, and multiplexer 103 based on the timing signals Vsync, Hsync, DE, and DCLK. The timing controller 106 may convert RGB data of an input image to RGBW data using a well-known white gain calculation algorithm and transmit it to the data driver 102.

Figure 3A:
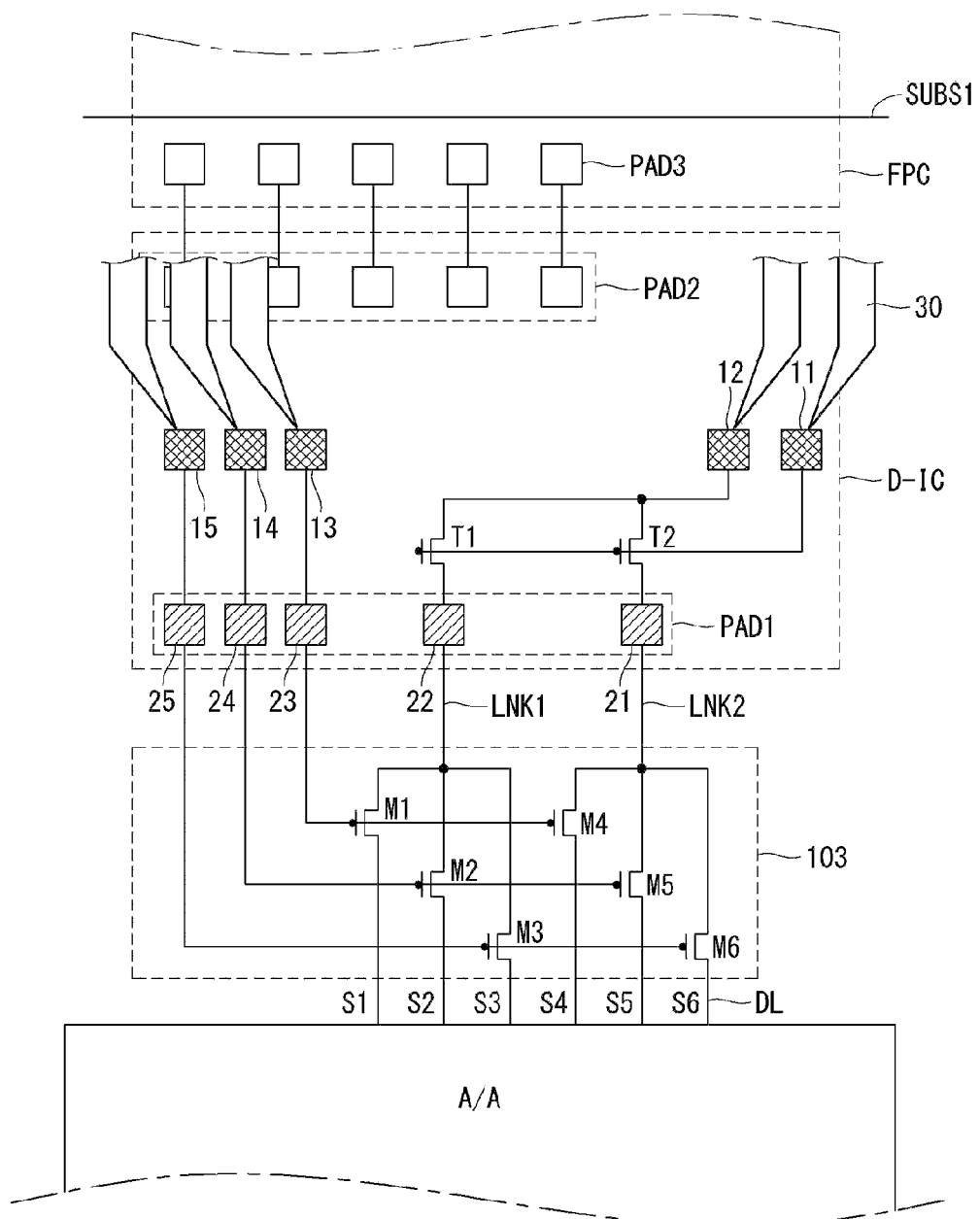
FIG. 3A is a circuit diagram showing pads and an AP test circuit which are disposed on a display panel prior to a drive IC mounting process.

In case of mobile devices, the data driver 120, the gate driver 102, the timing controller 106, and a DC-DC converter (not shown) may be integrated in a single drive circuit (D-IC of FIGS. 3A and 3B). The DC-DC converter generates DC operating voltages required to drive the display panel 100. The DC operating voltages comprise VGH and VGL of a gate pulse, a common voltage Vcom, a gamma reference voltage, etc. VGH is a gate high voltage which is higher than the threshold voltage of the TFTs, and VGL is a gate low voltage which is lower than the threshold voltage of the TFTs. The gamma reference voltage is divided by a voltage-divider circuit to produce a plurality of gamma compensation voltages corresponding to a gray scale, and the gamma compensation voltage is supplied to a DAC (digital-to-analog converter) of the data driver 102.

The host system 110 may be any one among a TV (television) system, a set-top box, a navigation system, a DVD player, a Blu-ray player, a personal computer (PC), a home theater system, and a phone system.

FIG. 3A is a circuit diagram showing pads and an AP test circuit which are disposed on a display panel prior to a drive IC mounting process. FIG. 3B is a view showing a drive IC and an FPC which are bonded onto the display panel after the drive IC mounting process.

Referring to FIGS. 3A and 3B, the AP test circuit comprises AP TRs T1 and T2 and AP pads 11 and 12.

The AP TRs T1 and T2 are connected to input channels of the multiplexer 103 via pads 21 to 25 of a first pad group PAD1. Data lines S1 to S6 are connected to output channels of the multiplexer 103.

The first pad group PAD1 comprises a plurality of pads 21 to 25 connected to the multiplexer 103. A second pad group PAD2 comprises a plurality of pads. Output bumps of the drive IC D-IC are bonded with an ACF to the pads 21 to 25 of the first pad group PAD1 in the drive circuit mounting process. Input bumps of the drive IC D-IC are bonded with an ACF to the pads of the second pad group PAD2 in the drive circuit mounting process. An FPC is bonded with an ACF to pads of a third pad group PAD3 to electrically connect the drive IC D-IC to the host system 110.

The first AP TR T1 is connected to drains of first to third TFTs M1 to M3 of the multiplexer 103 via the first pad 21. The second AP TR T2 is connected to drains of second to sixth TFTs M4 to M6 of the multiplexer 103. The first AP TR T1 comprises a gate connected to the first AP pad 11, a drain connected to the second AP pad 12, and a source connected to the second pad 22. The second AP TR T2 comprises a gate connected to the first AP pad 11, a drain connected to the second AP pad 12, and a source connected to the first pad 21.

First to third MUX control pads 13 to 15 are added for a lighting test. The third pad 23 is connected to the first MUX control pad 13. The fourth pad 24 is connected to the second MUX control pad 14. The fifth pad 25 is connected to the third MUX control pad 15.

The multiplexer 103 comprises a plurality of TFTs M1 to M6. The first TFT M1 comprises a gate connected to the third pad 23, a drain connected to the second pad 22, and a source connected to the first data line S1. The second TFT M2 comprises a gate connected to the fourth pad 24, a drain connected to the second pad 22, and a source connected to the second data line S2. The third TFT M3 comprises a gate connected to the fifth pad 25, a drain connected to the second pad 22, and a source connected to the third data line S3.

The fourth TFT M4 comprises a gate connected to the third pad 23, a drain connected to the first pad 21, and a source connected to the fourth data line S4. The fifth TFT M5 comprises a gate connected to the fourth pad 24, a drain connected to the first pad 21, and a source connected to the fifth data line S5. The sixth TFT M6 comprises a gate connected to the fifth pad 25, a drain connected to the first pad 21, and a source connected to the sixth data line S6.

Auto-probe needles 30 come into contact with the AP pads 11 and 12 and the MUX control pads 13 to 15 in the lighting test. An enable signal (EN (AP) of FIGS. 7 and 8) is applied to the first AP pad 11 through the auto-probe needles 30 in the lighting test. A test data voltage (DATA (AP) of FIGS. 7 and 8) is applied to the second AP pad 12 through the auto-probe needles 30 in the lighting test. MUX control signals (MUX R to MUX B of FIGS. 7 and 8) are applied to the MUX control pads 13 to 15 through the auto-probe needles 30 in the lighting test. The auto-probe needles 30 come into contact with gate pads (not shown) in the lighting test. The gate pads are connected to gate lines to feed a test gate pulse to the gate lines G1 to Gn through the auto-probe needles 30.

After the drive circuit mounting process, the input/output bumps of the drive IC are bonded with an ACF to the pads PAD1 and PAD2 on a lower substrate SUBS1 in a COG process. The input bumps of the drive IC D-IC are bonded to the pads of the second pad group PAD2. The output bumps of the drive IC D-IC are bonded to the pads of the first pad group PAD1. The FPC is bonded to the pads of the third pad group PAD3 in the drive circuit mounting process. After the drive circuit mounting process, the AP test circuit and the MUX control pads 13, 14, and 15 are covered by the drive IC D-IC, as shown in FIG. 3B. Accordingly, the AP test circuit and the MUX control pads 13, 14, and 15 are disposed in the IC mounting area covered by the drive IC D-IC, so it takes up no space on the display panel 100.

The AP test circuit of this invention is disposed in the IC mounting area, or in a flexible circuit board bonding area according to other exemplary embodiments to be described later. As a result, the present invention can reduce the bezel width of the display device since the AP test circuit is not provided in the bezel area. Also, the present invention allows for a lighting test on the display device because the AP test circuit can be disposed in displays for wearable devices with round or elliptical substrates.

The AP pads 11 and 12 and the AP TRs T1 and T2 are connected to the multiplexer 103 via link wires LNK1 and LINK2. The number of output channels of the multiplexer 103 is smaller than the number of its input channels. The input channels of the multiplexer 103 are connected to the output bumps of the drive IC D-IC via the link wires LNK1 and LNK2. The output channels of the multiplexer 103 are connected to the data lines S1 to S6. Accordingly, the number of output channels of the AP TRs T1 and T2 is much smaller than the number of data lines. In contrast, in the conventional art, as many AP TRs as the number of data lines are needed since they are connected to the data lines, respectively. Fewer AP TRs can decrease the area occupied by the AP test circuit and reduce the rate of defects in the manufacturing process.

In the conventional art, it was not possible to check whether the wires or link wires between the drive IC D-IC and the data lines S1 to S6 are disconnected (open). In contrast, in the present invention, the AP pads 11 and 12 and the AP TRs T1 and T2 are connected to the link wires LNK1 and LNK2 via the pads 21 and 22, to which the output bumps of the drive IC DC-IC are to be connected. This allows for detecting defects in the link wires LINK1 and LNIK2 between the drive IC D-IC and the data lines S1 to S6 and defects in the multiplexer 103.

In the drive circuit mounting process, the drive IC D-IC and the FPC are bonded onto the substrate SUBS1 of the display panel 100, as shown in FIG. 3B. Once the drive IC D-IC is bonded onto the substrate SUBS1 of the display panel 100, the MUX control signals (MUX R to MUX B of FIGS. 7 and 8) are fed to the multiplexer 103 via the pads 23 to 25 of the first pad group PAD1. Once the drive IC D-IC is bonded onto the substrate SUBS1 of the display panel 100, a data voltage output from the drive IC D-IC is fed to the data lines S1 to S6 via the second pads 21 and 22 of the first pad group PAD1 and the multiplexer 103. The AP test circuit is covered by the drive IC D-IC and not used in the drive circuit mounting process after the lighting test.

Figure 4:
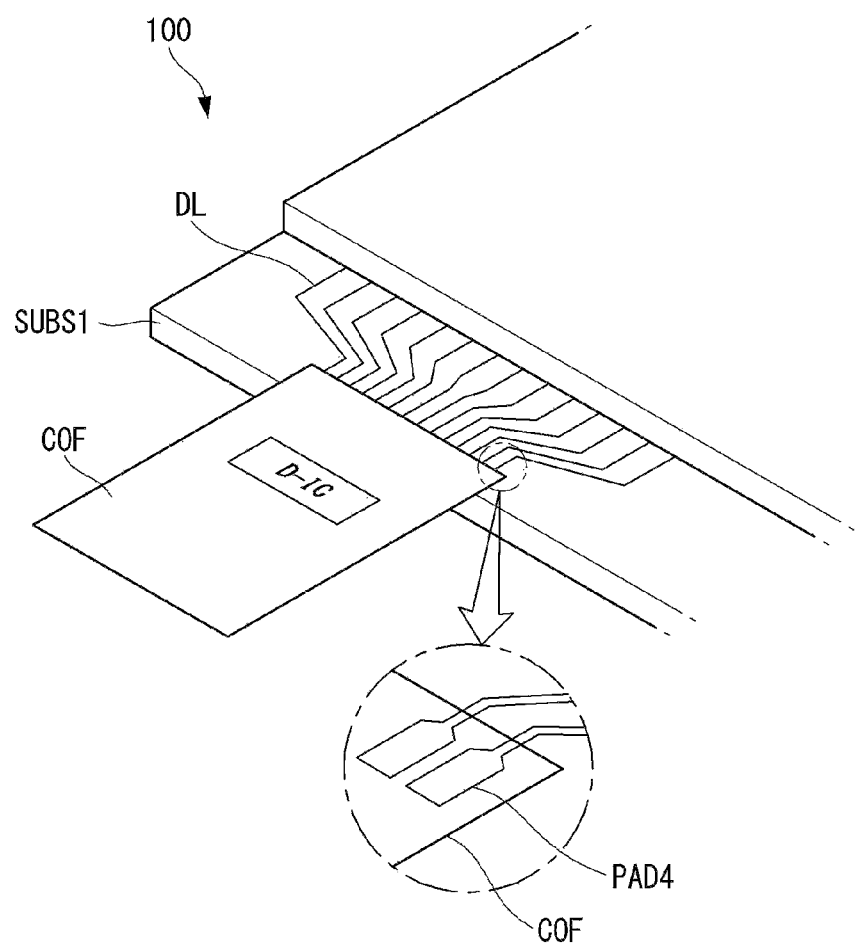
FIG. 4 is a view showing an example where a chip on film (COF) is bonded onto a substrate of the display panel.

The drive IC D-IC may be mounted on a flexible circuit board, as shown in FIG. 4. A flexible circuit board (chip on film (COF)) with the drive IC D-IC mounted on it is bonded onto the substrate SUBS1 of the display panel 100. "DL" of FIG. 4 denotes the data lines S1 to Sm. The AP test circuit may be disposed on the pads PAD4 covered by the flexible circuit board (COF) as shown in FIGS. 9 and 10. The AP test circuit also may be disposed on the pads of the third pad group PAD3 shown in FIGS. 3A and 3B. The AP test circuit may be divided into a part laid on the multiplexer 103, and another part laid on the pads PAD3 or PAD4.

FIGS. 5 to 6C are waveform diagrams showing the operation of the multiplexer when an input image is reproduced on the display panel.

Referring to FIGS. 5 to 6C, the drive IC D-IC outputs a data voltage for an input image, and at the same time, outputs the MUX control signals MUX R to MUX B. "Source (D-IC)" is a data voltage output from the data IC D-IC. The MUX control signals MUX R to MUX B and the data voltage are fed to the multiplexer 103 via the pads 21 to 25 of the first pad group, as shown in FIG. 3A.

The MUX control signals MUX R to MUX B are sequentially generated within 1 horizontal period 1H, in synchronization with the data voltage. The MUX control signals MUX R to MUX each have a pulse width corresponding to ⅓ horizontal period. As shown in FIG. 5, the drive IC D-IC may output a first data voltage fed to a red subpixel, a second data voltage fed to a green subpixel, and a third data voltage fed to a blue subpixel in time division method during 1 horizontal period 1H. In this case, the first TFT M1 turns on in response to the first MUX control signal MUX R and feeds the first data voltage from the drive IC D-IC to the first data line S1. The second TFT M2 turns on in response to the second MUX control signal MUX G and feeds the second data voltage from the drive IC D-IC to the second data line S3. The third TFT M3 turns on in response to the third MUX control signal MUX B and feeds the third data voltage form the drive IC D-IC to the third data line S3. If the first to third data voltages have a grayscale value of white, for example, 255, as shown in FIGS. 6A to 6C, the pixel displays white. If any one of the first to third data voltages has a white grayscale value and the other data voltages have a black grayscale value, the pixel displays either red, green, or blue.

FIGS. 7 to 8C are waveform diagrams showing the operation of a multiplexer and AP test circuit in a lighting test.

Referring to FIGS. 7 to 8C, in a lighting test, an auto-probe testing device outputs the MUX control signals MUX R to MUX B, the enable signal EN (AP), and the test data voltage DATA (AP) while the auto-probe needles 30 are in contact with the pads 11 to 15, as shown in FIG. 3A.

The enable signal EN (AP) is applied to the gates of the AP TRs T1 and T2 via the auto-probe needles 30 and the first AP pad 11 to turn on the AP TRs T1 and T2. The test data voltage DATA (AP) is applied to the drains of the AP TRs T1 and T2 via the second AP pad 12. Accordingly, in the lighting test, the AP TRs T1 and T2 feed the test data voltage DATA (AP) to the multiplexer 103 in response to the enable signal EN (AP).

The MUX control signals MUX R to MUX B are applied to the gates of the TFTs M1 to M6 of the multiplexer 103 via the auto-probe needles 30 and the MUX control pads 13 to 15 to turn on the TFTs M1 to M6. Accordingly, in the lighting test, the multiplexer 103 distributes the test data voltage DATA (AP) to the data lines S1 to S6.

In the present invention, various signal wires, the multiplexer 103, the pixels, etc. can be tested in the lighting test while displaying images of various colors by the pixels.

The auto-probe testing device generates the MUX control signals MUX R to MUX B, each with a pulse width corresponding to 1 horizontal period 1H. The MUX control signals MUX R to MUX B are synchronized with the test data voltage DATA (AP). The first TFT M1 turns on in response to the first MUX control signal MUX R and feeds the test data voltage DATA (AP) to the first data line S1. The second TFT M2 turns on in response to the second MUX control signal MUX G and feeds the test data voltage DATA (AP) to the second data line S2. The third TFT M3 turns on in response to the third MUX control signal MUX B and feeds the test data voltage DATA (AP) to the third data line S3.

The test data voltage DATA (AP) may have a grayscale value of white, for example, 255. When the MUX control signals MUX R to MUX B are simultaneously generated as shown in FIG. 7, the first to third TFTs M1 to M3 turn on and the pixel displays white. When only one of the MUX control signals MUX R to MUX B is generated as shown in FIGS. 8A to 8C, only one of the first to third TFTs M1 to M3 turns on. In this instance, the pixel displays either red, green, or blue.

As described above, the AP test circuit is formed in the area covered by the drive IC D-IC or flexible circuit board FPC or COF. In the latter case, once the flexible circuit board is bonded, the AP test circuit may be embedded in the pads PAD3 and PAD4, as shown in FIGS. 9 and 10.

FIG. 9 is a top plan view showing an example of the AP test circuit embedded in a pad. FIG. 10 is a cross-sectional view of a pad structure taken along the line "A-B-C" of FIG. 9.

Referring to FIGS. 9 and 10, the pad PAD4 comprises the AP TRs T1 and T2. The AP TRs T1 and T2 are disposed under an upper pad electrode ITO.

The AP TRs T1 and T2 each comprise a gate GE connected to a first AP wire 51, a drain DE connected to a second AP wire 52, and a source SE connected to an lower pad electrode SD. The first and second AP wires 51 and 52 are respectively connected to the pads 11 and 12 with which the auto-probe needles 30 come into contact. The lower pad electrode SD is connected to data lines DL.

In a lighting test process, the enable signal (EN (AP) of FIGS. 7 and 8) is applied to the gates GE of the AP TRs T1 and T2 via the first AP wire 51. The test data voltage (DATA (AP) of FIGS. 7 and 8) is applied to the drains DE of the AP TRs TR1 and T2 via the second AP wire 52. The AP TRs T1 and T2 feed the test data voltage DATA (AP) to the data lines DL in response to the enable signal EN (AP).

When the PAD4 is seen in cross section, a buffer insulating film BUF, a semiconductor pattern ACT, and a gate insulating film GI are stacked on the lower substrate SUBS1. A first metal pattern is formed on the gate insulating film GI. The first metal pattern comprises the gates GE of the AP TRs T1 and T2. Also, the gates of the TFTs in the pixel array, the gates of the TFTs M1 to M6 formed in the multiplexer 103, and the gate lines G1 to Gn are formed in the first metal pattern.

An interlayer insulating film ILD covers the first metal pattern. A second metal pattern is formed on the interlayer insulating film ILD. The second metal pattern comprises the sources SE and drains DE of the AP TRs T1 and T2, the AP wires 51 and 52, and the lower pad electrode SD. Also, the data lines S1 to Sm, the sources SE and drains DE of the TFTS in the pixel array, and the sources and drains of the TFTs M1 to M6 formed in the multiplexer 103 are formed in the second metal pattern.

The sources SE and drains DE of the TFTs come into contact with the semiconductor pattern ACT at the TFTs via contact holes pierced through the interlayer insulating film INT.

A first passivation film PAS1 covers the second metal pattern. A second passivation film PAS2 is formed on the first passivation film PAS1. A contact hole PHOLE exposing the lower pad electrode SD is formed in the second passivation film PAS2. The upper pad electrode ITO is formed on the second passivation film PAS2. The upper pad electrode ITO is formed of a transparent electrode material such as ITO (indium tin oxide). The first passivation film PAS1 may be formed of an inorganic insulating material such as SiOx or SiNx. The second passivation film PAS2 may be formed of an organic insulating material such as photoacryl.

As discussed above, in the present invention, a test circuit is connected to the multiplexer or signal wire pads in the area covered by an integrated circuit or flexible circuit board. As a consequence, the present invention allows for testing regardless of the shape of the display panel and achieves a narrow bezel since the test circuit takes up no extra space.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A display device, comprising:
a pixel array comprising pixels arranged in a matrix by the intersections of data lines and gate lines;
a multiplexer connected to the data lines; and
a test circuit comprising switching elements to be tested and test pads,
wherein the switching elements to be tested are connected to signal wire pads or to the multiplexer, the signal wire pads being connected to the data lines, and the test pads are connected to the switching elements to be tested.
2. The display device of claim 1, further comprising an integrated circuit (IC) connected to the multiplexer to feed a data voltage to the data lines.
3. The display device of claim 2, wherein the test circuit is covered by the integrated circuit (IC).
4. The display device of claim 3, wherein the number of switching elements to be tested is smaller than the number of data lines.
5. The display device of claim 4, wherein the switching elements to be tested are connected to input channels of the multiplexer via pads of a first pad group, the data lines are connected to output channels of the multiplexer, and output bumps of the integrated circuit are bonded to the pads of the first pad group.

6. The display device of claim 5, wherein the test pads comprise first and second auto-probe test pads,
   wherein the first pad group comprises first to fifth pads, and
   wherein the switching elements to be tested comprise gates connected to the first auto-probe test pad, drains connected to the second auto-probe test pad, and sources connected to the first and second pads of the first pad group, respectively.

7. The display device of claim 6, wherein the multiplexer comprises first, second, and third thin film transistors (TFTs),
   the first TFT comprising a gate connected to the third pad of the first pad group, a drain connected to the second pad, and a source connected to a first one data line,
   the second TFT comprising a gate connected to the fourth pad of the first pad group, a drain connected to the second pad, and a source connected to a second one data line, and
   the third TFT comprising a gate connected to the fifth pad of the first pad group, a drain connected to the second pad, and a source connected to a third one data line.

8. The display device of claim 1, further comprising a flexible circuit board connected to the signal wire pads.

9. The display device of claim 8, wherein the test pads comprise first and second auto-probe test pads, and
   the signal wire pads each comprise:
   an under-the pad electrode connected to the data lines; and
   an over-the-pad electrode connected to the under-the-pad electrode via a contact hole pierced through a passivation film.

10. The display device of claim 9, wherein the switching elements to be tested are disposed under the over-the-pad electrode, and the switching elements to be tested each comprise a gate connected to a first auto-probe wire, a drain connected to a second auto-probe wire, and a source connected to the under-the-pad electrode.

11. The display device of claim 1, further comprising a flexible circuit board with an integrated circuit (IC) mounted therein,
   the flexible circuit board being connected to the signal wire pads.

12. A display device, comprising:
   a display panel with signal wire pads connected to data lines;
   an integrated circuit (IC) that feeds a data voltage to the data lines;
   a multiplexer disposed on a substrate of the display panel, between the data lines and the integrated circuit;
   a flexible circuit board bonded onto the substrate of the display panel and connected to the signal wire pads; and
   a test circuit disposed on the substrate of the display panel,
   wherein the test circuit is covered by the integrated circuit or flexible printed circuit on the substrate of the display panel.

13. The display device of claim 12, wherein the test circuit comprises switching elements to be tested and test pads,
   wherein the switching elements to be tested are connected to the signal wire pads or to the multiplexer, the signal wire pads being connected to the data lines.

14. A method of testing a display device by using a test circuit comprising switching elements to be tested and test pads, the method comprising:
   connecting a multiplexer to data lines on a substrate of a display panel;
   connecting the switching elements to be tested to signal wire pads or to the multiplexer, on the substrate of the display panel, the signal wire pads being connected to the data lines;
   connecting the test pads to the switching elements to be tested, on the substrate of the display panel; and
   applying a test signal to the test pads in a test process to turn on the switching elements to be tested and feeding the test signal to the data lines via the multiplexer.

15. The method of claim 14, wherein the test circuit is disposed in an area covered by an integrated circuit or flexible circuit board, on the substrate of the display panel.

\* \* \* \* \*